(12) United States Patent
Bisschops

(10) Patent No.: US 6,630,984 B2
(45) Date of Patent: Oct. 7, 2003

(54) LITHOGRAPHIC APPARATUS, DEVICE MANUFACTURING METHOD, AND DEVICE MANUFACTURED THEREBY

(75) Inventor: Theodorus Hubertus Josephus Bisschops, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/919,616

(22) Filed: Aug. 1, 2001

(65) Prior Publication Data

US 2002/0027644 A1 Mar. 7, 2002

(30) Foreign Application Priority Data

Aug. 3, 2000 (EP) .............................. 00306684

(51) Int. Cl.⁷ ........................... G03B 27/52; G03B 27/42
(52) U.S. Cl. ........................................... 355/30; 355/53
(58) Field of Search ...................... 355/53, 30

(56) References Cited

U.S. PATENT DOCUMENTS

| | | | |
|---|---|---|---|
| 4,484,074 A | * 11/1984 | Eder | ........................ 250/332 |
| 4,916,322 A | 4/1990 | Glavish et al. | |
| 5,229,872 A | 7/1993 | Mumola | |
| 5,260,151 A | 11/1993 | Berger et al. | |
| 5,296,891 A | 3/1994 | Vogt et al. | |
| 5,523,193 A | 6/1996 | Nelson | |
| 5,877,843 A | * 3/1999 | Takagi et al. | .................. 355/30 |
| 5,969,441 A | 10/1999 | Loopstra et al. | |
| 6,046,792 A | 4/2000 | Van Der Werf et al. | |
| 6,053,704 A | * 4/2000 | Yamamoto et al. | .... 417/423.14 |
| 6,222,609 B1 | * 4/2001 | Nishimura | .................. 355/30 |

FOREIGN PATENT DOCUMENTS

| | | |
|---|---|---|
| EP | 0 532 968 A1 | 3/1993 |
| EP | 0 844 532 A2 | 5/1998 |
| EP | 0965888 | 12/1999 |
| WO | WO 98/40791 | 7/2001 |

OTHER PUBLICATIONS

Murphy et al., "Synchroton Radiation Sources and Condensers for Projection X–Ray Lithography," *Applied Optics*, vol. 32, No. 24, 1993, pp. 6920–6929.

* cited by examiner

*Primary Examiner*—Rodney Fuller
(74) *Attorney, Agent, or Firm*—Pillsbury Winthrop LLP

(57) ABSTRACT

A lithographic projection apparatus including at least one temperature control member that at least partly surrounds at least one component selected from a group comprising mask and substrate tables, the projection system and an isolated reference frame for controlling the temperature of the surrounded components. The surface finish of the member is chosen to help keep the components which it partly surrounds isothermal during operation.

19 Claims, 1 Drawing Sheet

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to a lithographic projection apparatus and more particularly to a lithographic projection apparatus including a temperature control system.

2. Background of the Related Art

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus, the size of features that can be imaged onto the wafer is limited by the wavelength of the projection radiation. To produce integrated circuits with a higher density of devices and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser-produced plasma sources, discharge plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Other proposed radiation types include electron beams and ion beams. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Wafers can be contaminated and optical elements for EUV radiation can be spoiled by the deposition of carbon layers on their surface, which imposes the additional requirement that hydrocarbon partial pressures should generally be kept below $10^{-8}$ or $10^{-9}$ millibar. Otherwise, for apparatus using EUV radiation, the total vacuum pressure need only be $10^{-3}$ or $10^{-4}$ mbar, which would typically be considered a rough vacuum.

Further information with regard to the use of electron beams in lithography can be gleaned, for example, from U.S. Pat. Nos. 5,079,122 and 5,260,151, as well as from EP-A 0 965 888.

SUMMARY OF THE INVENTION

Temperature stability of some critical components is quite important in lithographic apparatus, since a change in temperature will lead to thermal expansion or contraction and associated imaging errors. It is therefore an object of the invention to provide an improved lithographic projection apparatus in which components can better be maintained isothermal.

According to the present invention, this and other objects are achieved in a lithographic apparatus including a radiation system for providing a projection beam of radiation, a support structure for supporting patterning structure, the patterning structure serving to pattern the projection beam according to a desired pattern, a substrate table for holding a substrate, a projection system for projecting the patterned beam onto a target portion of the substrate, an isolated reference frame on which position sensors for at least one of the patterning structure and substrate are mounted, a vacuum chamber enclosing at least one component selected from a group comprising said support structure, said substrate table, said projection system and said isolated reference frame and at least one temperature control member that at least partially surrounds one of said components in said vacuum chamber, said temperature control member being at least partly formed of a material having at least partly a substantially absorption and emission-inhibiting surface finish for keeping said one component substantially isothermal during operation.

Absorption and emission of a surface are generally related. Low absorption implies low emission and vice versa; absorption and emission coefficients will have identical values. In case the temperature control member is provided with an absorption and emission-inhibiting surface finish on a surface facing the surrounded component, a temperature change of the temperature control member will not or will hardly constitute a heat load on the components through radiation since the emission coefficient will be very low, meaning that the control member will not or will hardly radiate energy and that the temperature of the component will not be effected. On the other hand, in case the temperature control member is provided with an absorption and emission-inhibiting surface finish on a surface facing away from the surrounded component and facing towards an external heat source, the temperature of the control member will not or hardly change since it will not absorb the energy radiated by the heat source. Since the temperature of the control member does not change, it will not present a heat load on the surrounded component. Preferably, the emission coefficient of the absorption and emission-inhibiting surface finish is less than 0.1, and more preferably less than 0.05. Such a surface finish may be achieved by applying a mirror-like surface finish.

In another embodiment, at least part of a surface of said temperature control member which faces towards at least one of said component and a heat source internal of said vacuum chamber comprises a substantially absorption and emission promoting surface finish. For this embodiment, the temperature of the component may be regulated by radiation incident from the control member. On the other hand, any radiation from a heat source that faces the absorption and emission promoting surface finish will be absorbed by that surface of the temperature control member and become absorbed. In this way it is prevented that the heat source is reflected by that surface and becomes a heat load on the critical component. The emission coefficient of the absorption and emission promoting surface finish may be at least 0.9, and more specifically, may be at least 0.95. Such a surface finish may be applied by applying a black surface finish.

Further, the temperature control member preferably has a large thermal conductivity, advantageously above 100 W/milliKelvin (W/mK) to keep the temperature control member in a predetermined temperature range.

The temperature control member may be the wall of the vacuum chamber, a separate enclosure at a distance from the vacuum chamber wall, or a thermal baffle over an opening to a vacuum pump. Such control member may also be combined.

According to a further aspect of the invention there is provided a device manufacturing method including projecting a patterned beam of radiation onto a target portion of a layer of radiation-sensitive material on a substrate; and maintaining a substantially isothermal condition in a component provided in a vacuum chamber of a lithographic projection apparatus using at least one temperature control member at least partially surrounding the component, said temperature control member being at least partially formed of a material having an absorption and emission inhibiting surface finish.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultraviolet (EUV or XUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

DETAILED DESCRIPTION

Figure 1:
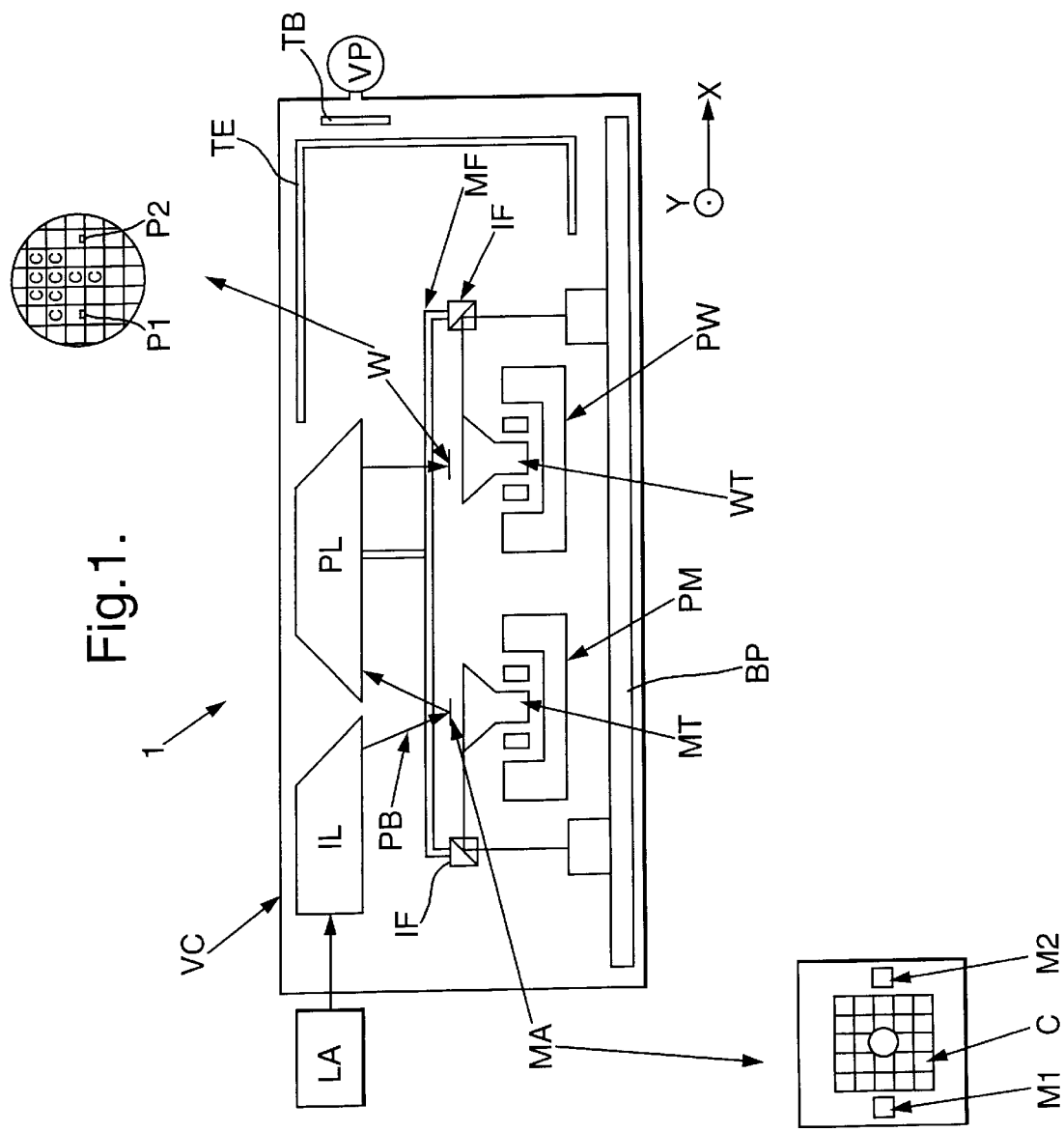
FIG. 1 depicts a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. EUV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a reflective projection system) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. laser-produced plasma source or a discharge source) produces a beam of radiation. This beam is fed into an illumination system (illuminator) IL, either directly or after having traversed conditioning means, such as a beam expander, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The lithographic projection apparatus of the example includes a vacuum chamber VC in which the beam PB impinges upon the mask MA and subsequently onto the target area of the substrate W.

A so-called "metrology frame" MF provides an isolated frame of reference, which is mechanically isolated from the main apparatus structure, to support sensitive components such as the interferometers IF and other position sensors and isolate them from vibration. Even though the reference frame may be made of a material with a very low coefficient of thermal expansion, such as Invar (TM), the metrology frame and attached components should be kept isothermal but if not the maximum temperature difference should be less than 0.1° C.

The lithographic projection apparatus of the present embodiment includes an enclosure as a temperature control member surrounding some components to influence the temperature of the components surrounded by the enclosure. Typical components surrounded by such an enclosure include the first and second object tables, the projection system and the metrology frame. The enclosure is at least partially formed by the walls of the vacuum chamber VC in the present embodiment. Another enclosure TE is seen to be present between a part of the vacuum chamber wall and temperature critical components. The drawing is for illustrative purposes only. In a practical situation such a thermal enclosure TE may enclose such a critical component fully.

A vacuum pump VP is associated with the vacuum chamber and may be at quite a high temperature. For example, the rotor of a turbo-molecular pump may be as high as 80° C. Providing a thermal baffle TB, as another temperature control member, over the opening to the vacuum pump aids in keeping the components inside the vacuum chamber isothermal.

According to the present invention a special surface finish is applied to the temperature control members in the lithographic projection apparatus for controlling the temperature of components which the member at least partly surrounds. The members of interest may be those of an enclosure, a vacuum chamber wall or a thermal baffle as described above.

The members for controlling the temperature are provided with a mirror-like surface finish, e.g. by polishing. Such a surface finish provides an absorption and emission-inhibiting surface finish having a low emissivity or emission coefficient, preferably below 0.1 or even below 0.05. Also preferably, the mirror-like surface finish is applied to material which has a low emission coefficient itself. The mirror-like surface finish is applied to the inside surface of the wall of vacuum chamber VC, to the outside of enclosure TE facing the vacuum chamber wall and on both sides (facing towards vacuum pump VC and towards enclosure TE) of baffle TB.

The result of this is that thermal variations in the vacuum chamber wall are not radiated onto the partly surrounded components; precise temperature control of the wall is not a very important issue because it does not radiate much energy. In this embodiment, the vacuum chamber wall has a surface prepared such that the emissivity, the ratio of emissive power of a surface at a given temperature to that of a black body at the same temperature and with the same surroundings, is optimally at most 0.1 and preferably no higher than 0.05. In this way the maximum temperature difference in the partly surrounded components may be kept as low as 0.1° C. which is the requirement in some lithographic projection apparatus.

However, heat sources within the vacuum chamber may have their radiation reflected by the mirror-like vacuum chamber wall onto temperature critical components. A separate enclosure TE having a surface finish that promotes absorption is therefore employed. The absorption (and emission) promoting surface finish of temperature control member TE is applied at a surface facing towards the inside of the vacuum chamber. Radiation from heat sources will be absorbed and not be reflected and constitute a heat load on other components. A black-surface finish will provide a high emissivity or emission coefficient having preferably a value above 0.9 or even 0.95. A vacuum-compatible coating of $SiO_2$ also provides a high emission coefficient of about 0.9. In this way the temperature of the partly enclosed components can also be controlled to be the same as that of enclosure TE because the enclosure radiates efficiently and efficiently absorbs radiation irradiated by the enclosed components The side of enclosure TE facing the vacuum chamber wall is provided with an absorption inhibiting (mirror-like) surface finish to reflect any residual radiation from vacuum chamber wall VC or thermal baffle TB. In this way an even better temperature control will be achieved. Thermal baffle TB is provided with an absorption and emission-inhibiting surface finish on both sides to not absorb radiation from vacuum pump VP and to not radiate towards enclosure TE for better temperature control.

Enclosure TE may also be constructed such that it tightly encloses a temperature-critical component inside the vacuum chamber. Further, the temperature-critical component may be provided with an absorption-inhibiting surface finish to reflect any residual heat load radiation or with an absorption-promoting surface finish for efficient temperature control by enclosure TE.

It has also been found that materials with a thermal conductivity of greater than 100 W/mK result in the temperature of the enclosure being advantageously kept more nearly uniform. Preferably the material of the member for controlling temperature has a thermal conductivity of greater than 200 W/mK. Examples of such materials are aluminum, copper and alloys thereof. Any means of regulating the temperature of the temperature control member are also advantageously employed, such a provision of channels in the temperature control member for passing a fluid such as water.

While specific embodiments of the invention have been described above, it will be appreciated that the invention may be practiced otherwise than as described. The description is not intended to limit the invention.

What is claimed is:

1. A lithographic projection apparatus comprising:
   a radiation system to provide a projection beam of radiation;
   a support structure to support patterning structure to pattern the projection beam according to a desired pattern;
   a substrate table to hold a substrate;
   a projection system to project the patterned beam onto a target portion of the substrate;
   a vibrationally isolated reference frame;
   at least one position sensor constructed and arranged to monitor a position of at least one of the patterning structure and substrate mounted on the reference frame;
   a vacuum chamber enclosing at least one component selected from a group comprising said support structure, said substrate table, said projection system and said isolated reference frame; and
   at least one temperature control member operatively associated with said at least one component and comprising a substantially absorption and emission-inhibiting surface finish such that said at least one component is maintained substantially isothermal during operation.

2. A lithographic projection apparatus according to claim 1, wherein said absorption and emission-inhibiting surface finish comprises a substantially mirror-like surface finish.

3. A lithographic projection apparatus according to claim 1, wherein an emission coefficient of said absorption and emission-inhibiting surface finish is less than 0.1.

4. A lithographic projection apparatus according to claim 3, wherein said emission coefficient of said absorption and emission-inhibiting surface finish is less than 0.05.

5. A lithographic projection apparatus according to claim 1, wherein at least part of a surface of the temperature control member which faces towards at least one of said component and a heat source internal of said vacuum chamber comprises a substantially absorption and emission-promoting surface finish.

6. A lithographic projection apparatus according to claim 5, wherein said absorption and emission-promoting surface finish comprises a black surface finish.

7. A lithographic projection apparatus according to claim 5, wherein an emission coefficient of said absorption and emission-promoting surface finish is at least 0.9.

8. A lithographic projection apparatus according to claim 7, wherein said emission coefficient of said absorption and emission-promoting surface finish is at least 0.95.

9. A lithographic projection apparatus according to claim 1, wherein a surface of said temperature control member which comprises said absorption and emission-inhibiting surface finish faces towards a heat source external of a space that is at least partially surrounded by said temperature control member and that comprises said component.

10. A lithographic projection apparatus according to claim 1, wherein a thermal conductivity of a material of said temperature control member is at least 100 W/mK.

11. A lithographic projection apparatus according claim 1, wherein said temperature control member comprises a material selected from the group comprising aluminum, aluminum alloys, copper and copper alloys.

12. A lithographic projection apparatus according to claim 1, wherein said temperature control member is at least partially formed by walls of said vacuum chamber.

13. A lithographic projection apparatus according to claim 1, wherein said temperature control member comprises an enclosure provided at a distance from a wall of said vacuum chamber.

14. A lithographic projection apparatus according to claim 1, wherein said temperature control member comprises a wall of a thermal baffle provided over an opening to a vacuum pump.

15. An apparatus according to claim 1, wherein the support structure comprises a mask table for holding a mask.

16. An apparatus according to claim 1, wherein the radiation system comprises a radiation source.

17. An apparatus according to claim 1, wherein said projection beam comprises EUV radiation having a wavelength in the range of about 5 nm to about 20 nm.

18. A device manufacturing method comprising:

projecting a patterned beam of radiation onto a target portion of a layer of radiation-sensitive material on a substrate; and maintaining a substantially isothermal condition in a component provided in a vacuum chamber of a lithographic projection apparatus using at least one temperature control member at least partially surrounding the component, said temperature control member being at least partially formed of a material having an absorption and emission inhibiting surface finish.

19. A device manufactured according to the method of claim 18.

* * * * *